United States Patent [19]
Deisch

[11] Patent Number: 4,784,613
[45] Date of Patent: Nov. 15, 1988

[54] APPARATUS FOR JOINING CONDUCTORS TO CIRCUIT BOARDS

[75] Inventor: Cecil W. Deisch, Warrenville, Ill.

[73] Assignee: American Telephone and Telegraph Company, AT&T Information Systems, Holmdel, N.J.

[21] Appl. No.: 115,296

[22] Filed: Nov. 2, 1987

[51] Int. Cl.⁴ .................... H01R 9/07; H01R 9/09
[52] U.S. Cl. ....................... 439/405; 439/493
[58] Field of Search .............. 439/55, 67, 77, 82, 439/329, 391–410, 443, 444, 492–496

[56] References Cited

U.S. PATENT DOCUMENTS

| | | | |
|---|---|---|---|
| 3,223,960 | 12/1965 | Ruehlemann | 339/221 |
| 3,444,506 | 5/1969 | Wedekind | 339/99 |
| 3,846,740 | 11/1974 | Damon | 339/220 |
| 4,049,334 | 9/1977 | Siden | 439/55 |
| 4,094,572 | 6/1978 | Burr et al. | 439/400 |
| 4,175,816 | 11/1979 | Burr et al. | 439/400 |
| 4,695,258 | 9/1987 | Hanson et al. | 439/67 |

Primary Examiner—Neil Abrams
Attorney, Agent, or Firm—Dwight A. Marshall

[57] ABSTRACT

Apparatus for terminating conductors on circuit boards. The apparatus comprises an insulator member having electrical conducting contacts embedded therein each with a bifurcate portion extending from the insulator member. The bifurcate portion consists of a pair of prongs arranged for engaging a conductor and a complaint section having an end formed both for piercing insulation of the conductor and insertion into a circuit board plated-through hole to establish an electrical connection between the engaged conductor and circuit board.

6 Claims, 1 Drawing Sheet

APPARATUS FOR JOINING CONDUCTORS TO CIRCUIT BOARDS

TECHNICAL FIELD

This invention relates to connector apparatus. In particular, it relates to connector apparatus arranged for terminating a conductor on a circuit board.

PROBLEM

Circuit boards mounting components are widely used by Telecommunications and Electronic Industries in the manufacture of electrical and electronic equipment. Such circuit boards are coupled together by cables which function to interconnect the circuit board components together to form large complex electronic equipment such as telephone switching and computer systems. Cables used in interconnecting electrical and electronic equipment circuit boards generally have multiple conductors that are terminated on backplanes of equipment mounting apparatus arranged to receive the circuit boards which are then interconnected by connector apparatus the cable conductors.

Connector contacts, oftentimes referred to as insulation pierce type of contacts, are sometimes used to terminate an insulated conductor on a circuit board. Such insulation pierce contacts generally have a bifurcate section formed at one end to pierce the conductor insulation and engage the conductor. The opposite end o the contact is formed into a tail section intended for anchoring the insulation pierce contact in a mounting surface such as a circuit board. A problem arises in the use of these contacts in that two separate operations, one at each end of the contact, are required to terminate an insulated conductor on the mounting surface.

Specifically configured devices have been developed to mount these types of contacts and such devices are intended to be positioned betewen a circuit board and the insulated conductor. Such devices are usually formed to first receive and terminate the insulated conductors of a cable. Subsequently, the combined cable and specifically designed device are affixed to the circuit board. This apparatus still requires two separate operations and gives rise to an additional problem in that specially designed devices are required to terminate the insulated conductors on circuit boards.

SOLUTION

The foregoing problems are solved and apparatus for terminating conductors on circuit boards is substantially enhanced by an insulating member having electrical conducting contacts embedded therein wherein each electrical conducting contact has a bifurcate portion extending from a side of the insulating member for engaging a conductor and which is extended into a compliant section formed both for piercing insulation of the conductor and for insertion into a circuit board plated-through hole to establish an electrical connection between the conductor and circuit board.

The electrical conducting contact bifurcate portion consists of a pair of prongs extending from sides of the insulating member with each prong having an inner cutting surface positioned parallel to a center line of the contact for use in engaging the conductor between prongs. In addition, each prong has a tine diverging from the center line with an end having an angled cutting surface formed both for piercing insulation of the conductor and insertion into a circuit board plated-through hole. A side edge is formed on the outside of each tine opposite and parallel to the contact center line to engage a side of the circuit board plated-through hole so that an electrical connection may be established between the conductor and circuit board conducting paths and components coupled with the plated-through hole.

DETAILED DESCRIPTION

Figure 1:
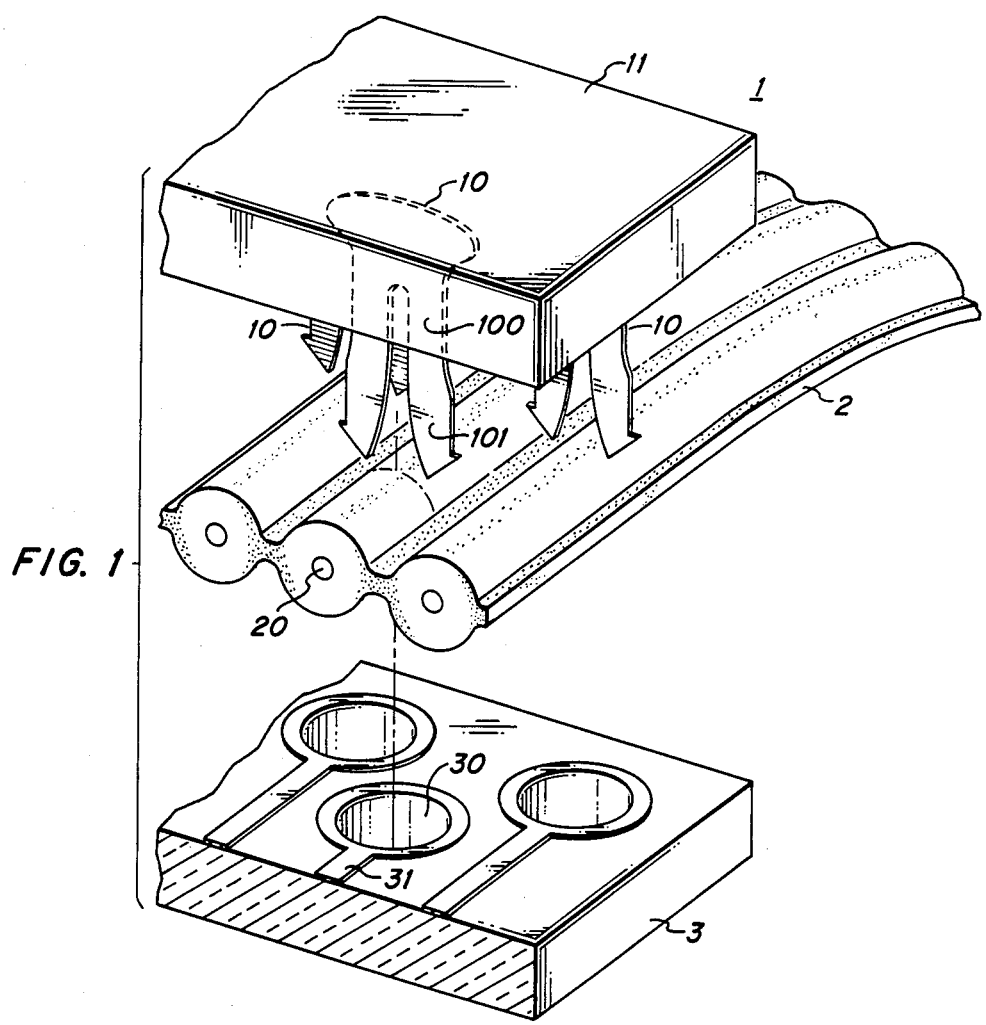
FIG. 1 is an exploded view of the connector apparatus embodying the principles of the invention.

Circuit board 3, set forth in FIG. 1 of the drawing, is made of an insulating material such as epoxy glass and is intended to mount electrical and electronic components which are interconnected to form a larger composie circuit part of electrical and electronic equipment. Such circuit board oftentimes have holes drilled therein that are used to receive terminals and leads of the components positioned on the circuit board. Such holes have solder plated metallic walls forming plated-through holes 30 which are extended into conducting paths 31 on circuit board 3 that electrically couple the circuit board components together.

Conductor cables may be used to couple multiple circuit boards 3 together to form the larger composite circuit. Such conductor cables may be a single electrically insulated conductor or may be a cable having a number of conductors each of which are to be terminated on circuit board 3. Multiple conductor cables may have either parallel or staggered aligned conductors 20 that are embedded in a flexible insulating material, such as a polyvinyl chloride material, to form a conductor cable hereinafter referred to as ribbon cable 2.

Figure 2:
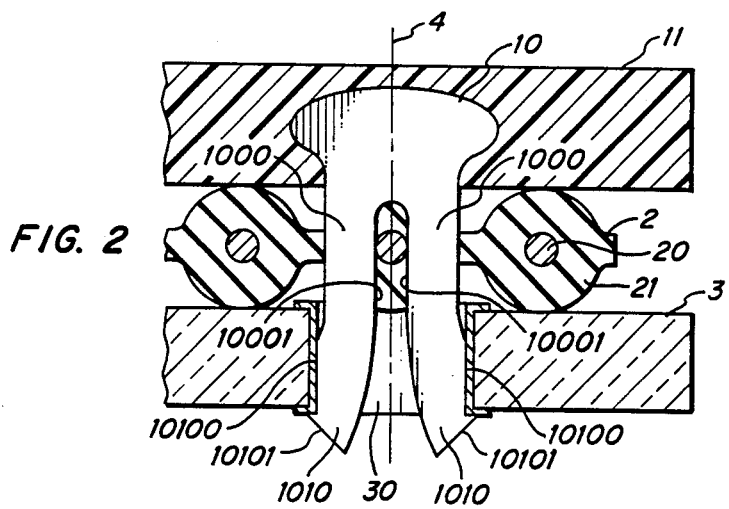
FIG. 2 is a cross-sectional view of the connector apparatus set forth in FIG. 1 assembled to terminate a conductor on a circuit board.

Connector apparatus 1, for terminating a single conductor 20 or conductors 20 of ribbon cable 2 on circuit board 3, has a generally rectangular configured member 11 formed of insulating material such as polyphenylene sulfide. A single or plurality of contacts 10, formed of an electrically conducting material, is embedded within insulator member 11 in a single, row or row and column configuration to extend from a surface thereof. Each electrical conducting member 10, FIG. 1, has a bifurcate portion 100 consisting of a pair of prongs 1000, FIG. 2, that extend from a side of insulator member 11. In addition, prongs 1000 each have an inner cutting surface 10001 positioned parallel to a center line 4 of electrical conducting contact 10 for cutting insulation material of and engaging conductor 20 between prongs 1000.

Electrically conducting contact prongs 1000 also form a compliant section 101, FIG. 1, for piercing insulation of conductor 20 and insertion into plated-through hole 30. An electrical connection is thereby established from conductor 20 engaged between prongs 1000, FIG. 2, through electrical conducting contact 10 and compliant section 101, FIG. 1, with plated-through hole 30 of circuit board 3. Compliant section 101 is formed by each prong 1000, FIG. 2, which has a tine 1010 diverging outward from and at an angle formed with respect to center line 4.

Each tine 1010 has an end with an angled cutting surface 10101 formed outward and upward from the tip thereof both for piercing the insulation of ribbon cable 2 or insulation of conductor 20 and for insertion into one of the circuit board plated-through holes 30. In addition, each tine 1010 has a smooth or barbed side edge 10100 formed on the outside of tine 1010 opposite and parallel to center line 4 for the purpose of engaging a side of plated-through hole 30 and establishing an electrical connection between conductor 20 with conducting paths 31 and circuit components located on circuit board 3. Angled cutting surface 10101 may be connected by an edge positioned perpendicular to center line 4 with side edge 10100 and cooperates with compliant section 101 after insertion of electrical conducting contact 10 by engaging an outer surface of plated-through hole 30 to prevent disengagement of conductor 2 from circuit board 3.

In assembly, insulator member 11 is positioned over ribbon cable 2 and pressed downward thereon such that angled cutting surface 10101 of electrically conducting contacts 10 pierces the insulation around conductors 20. Each conductor 20 moves upward between tines 1010 of compliant section 101 and between prongs 1000 of bifurcate portion 100 thereby enabling inner cutting surfaces 10001 to cut into and engage conductor 20 as pressure continues to be applied to insulator member 11. Angled cutting surfaces 10101 also guides compliant sections 101 into plated-through holes 30 of circuit board 3 and enable tine sine edges 10100 to engage sides of plated-through holes 30. As downward pressure continues to be applied to insulator member 11, angled cutting surfaces 10101 emerge from plated-through holes 30 with the edges engaging the bottom outer surface of plated-through holes 30. Connector apparatus 1 thereby establishes electrical connections between conductors 20 through electrically conducting contacts 10 and plated-through holes 30 with circuit board conducting paths 331 and components that may be mounted upon circuit board 3.

In accordance with the principles of the invention, connector apparatus 1 may be arranged such that embedded electrically conducting contacts 10 may extend from top and bottom surfaces of insulator member 11. Such an arrangement enables combinations of ribbon cables 2 and circuit boards 3 to be interconnected in a stacked above and below or side-by-side arrangement to facilitate the packing of circuit boards 3 in electrical and electronic equipment. In addition, contact 10 may be used independently of insulator member 11, in the manner of a staple to connect conductor 10 with circuit board 3.

What is claimed is:

1. Apparatus for terminating a conductor on a plated-through hole of a circuit board said apparatus comprising
    an insulator member having an electrical conducting contact embedded therein with a bifurcate portion consisting of a pair of prongs extending from a side of said insulator member for engaging the conductor therebetween and said prongs forming a compliant section with an end thereof formed both for piercing insulation of the conductor and for insertion into the circuit board plated-through hole to engage sides thereof and thereby establish an electrical connection between the conductor and circuit board plated-through hole.

2. Apparatus for terminating a conductor on a circuit board having a plated-through hole coupled with a conducting path and components located on the circuit board said apparatus comprising
    an insulator member having an electrical conducting contact embedded therein with a bifurcate portion consisting of a pair of prongs extending from a side of said insulator member for engaging the conductor therebetween and each of said prongs having a tine diverting from a center line of said contact with an end formed both for piercing insulation of the conductor and insertion into the circuit board plated-through hole and having a side edge formed on the outside of said tine opposite the center line for engaging a side of the circuit board plated-through hole and establishing an electrical connection between the conductor and circuit board conducting path and components.

3. Apparatus for terminating conductors of a ribbon cable on a circuit board having plated-through holes coupled with conducting paths and components located on the circuit board said apparatus comprising
    an insulator member having electrical conducting contacts embedded therein in a row and column configuration each with a bifurcate portion consisting of a pair of prongs extending from a side of said insulator member for engaging a conductor of the ribbon cable therebetween and each of said prongs having a tine diverging from a center line of said contact with an end having an angled cutting surface formed both for piercing insulation of the ribbon cable and insertion into one of the circuit board plated-through holes and having a side edge formed on the outside of said tine opposite and parallel to the center line for engaging a side of said one circuit board plated-through hole and establishing an electrical connection between the ribbon cable conductor and circuit board conducting paths and components.

4. Apparatus for terminating conductors of a ribbon cable on a circuit board having plated-through holes coupled with conducting paths and components located on the circuit board said apparatus comprising
    a generally rectangular configured member formed of insulating material and having electrical conducting contacts embedded therein in a row and column configuration each with a bifurcate portion consisting of a pair of prongs extending from a side of said insulator member with each having an inner cutting surface positioned parallel to a center line of the contact for engaging a conductor of the ribbon cable between said prongs and each of said prongs having a tine diverging from the center line of said contact with an end having an angled cutting surface formed both for piercing insulation of the ribbon cable and insertion into one of the circuit board plated-through holes and having a side edge formed on the outside of said tine opposite and parallel to the contact center line for engaging a side of said one circuit board plated-through hole and establishing an electrical connection between the ribbon cable conductor and circuit board conducting paths and components.

5. Apparatus for terminating an insulated conductor on a plated-through hole of a circuit board said apparatus comprising
    an electrical conducting contact with a bifurcate portion consisting of a pair of prongs with each prong having an inner cutting surface positioned parallel to a center line of the contact for engaging the conductor between said prongs and each of said prongs having a tine diverging from the center line of said contact with an end having an angled cutting surface formed both for piercing insulation of the insulated conductor and insertion into the circuit board plated-through hole and having a side edge formed on the outside of said tine opposite and parallel to the center line for engaging a side of the circuit board plated-through hole and establishing an electrical connection between the conductor and circuit board plated-through hole.

6. Apparatus for terminating conductors on a circuit board said apparatus comprising in combination
a circuit board having electrically conducting plated-through holes therein for terminating conducting paths and components on the circuit board,
a ribbon cable having a plurality of insulated conductors for interconnection with the circuit board, and
a generally rectangular configured member formed of insulating material and having electrical conducting contacts embedded therein in a row and column configuration each with a bifurcate portion consisting of a pair of prongs extending from a side of said insulator member with each having an inner cutting surface positioned parallel to a center line of the contact for engaging one of said conductors of said ribbon cable between said prongs and each of said prongs having a tine diverging from a center line of said contact with an end having an angled cutting surface formed both for piercing said insulated conductor and for insertion into one of the circuit board plated-through holes and having a side edge formed on the outside of said tine opposite and parallel to the contact center line for engaging a side of said one circuit board plated-through hole and establishing an electrical connection between said ribbon cable conductor and the circuit board conducting paths and components.

* * * * *